United States Patent
Leong et al.

(10) Patent No.: US 10,584,514 B2
(45) Date of Patent: Mar. 10, 2020

(54) HANDLE ASSEMBLY

(71) Applicant: Telezygology, Inc., Chicago, IL (US)

(72) Inventors: William Leong, Chicago, IL (US);
Cary Maguire, Chicago, IL (US);
Glenn Bevan, Wooloongabba (AU);
Craig Roughen, Wooloongabba (AU)

(73) Assignee: TELEZYGOLOGY INC., Chicago, IL (US)

( * ) Notice: Subject to any disclaimer, the term of this patent is extended or adjusted under 35 U.S.C. 154(b) by 0 days.

(21) Appl. No.: 14/646,399

(22) PCT Filed: Nov. 21, 2013

(86) PCT No.: PCT/US2013/071135
§ 371 (c)(1),
(2) Date: May 21, 2015

(87) PCT Pub. No.: WO2014/081907
PCT Pub. Date: May 30, 2014

(65) Prior Publication Data
US 2015/0300047 A1    Oct. 22, 2015

Related U.S. Application Data

(60) Provisional application No. 61/729,290, filed on Nov. 21, 2012.

(51) Int. Cl.
*E05B 13/10* (2006.01)
*E05B 1/00* (2006.01)
(Continued)

(52) U.S. Cl.
CPC .......... *E05B 47/0001* (2013.01); *E05B 1/003* (2013.01); *E05B 1/0084* (2013.01);
(Continued)

(58) Field of Classification Search
CPC ........ E05B 13/00; E05B 13/10; E05B 13/105; E05B 13/106; E05B 47/0001; E05B 47/0009; E05B 1/0092
See application file for complete search history.

(56) References Cited

U.S. PATENT DOCUMENTS

| | | | | | |
|---|---|---|---|---|---|
| 4,753,465 | A | * | 6/1988 | Dalby | B64G 1/645 244/173.3 |
| 5,893,282 | A | * | 4/1999 | Runge | E05B 63/0056 70/208 |

(Continued)

FOREIGN PATENT DOCUMENTS

| | | | | |
|---|---|---|---|---|
| EP | 2476825 | * | 7/2012 | E05B 47/00 |
| JP | 2008169626 | | 7/2008 | |

(Continued)

OTHER PUBLICATIONS

PCT/US2013/071135, International Search Report and Written Opinion, dated Feb. 13, 2014, 5 pages—English.

*Primary Examiner* — Emily M Morgan
(74) *Attorney, Agent, or Firm* — Andrew F. Young, Esq.; Lackenbach Siegel, LLP

(57) ABSTRACT

The invention is useful for upgrading a mechanical handle assembly to an electronic handle assembly without the need to remove the handle from the door or the like to which the handle is attached. The handle assembly (100) is of the type which is mountable to a surface of a door. Handle (18') is moveable between a locked position and an unlocked position. A first housing useful for a mechanical locking handle is replaceable by a second housing (80) during conversion of the handle assembly from a mechanical version to an electronic version. Handle (18') is received at least partially within the housing (80) and is substantially within housing (80) in the locked position. In the unlocked position, handle (18') protrudes from the housing (80) and can be cause to (Continued)

swing sideways. Opening of the door when handle (18') is in the locked position is prevented by a lock (24'). When converted to the electronic version, lock (24') may remain but is capable of being unlocked by electronic actuation means (44, 78, 82).

4 Claims, 11 Drawing Sheets

(51) Int. Cl.
    *E05B 47/00*     (2006.01)
    *E05B 47/06*     (2006.01)
    *H05K 7/18*     (2006.01)
    *E05B 41/00*     (2006.01)

(52) U.S. Cl.
    CPC ........ *E05B 1/0092* (2013.01); *E05B 47/0009* (2013.01); *E05B 47/0657* (2013.01); *H05K 7/18* (2013.01); *E05B 13/10* (2013.01); *E05B 41/00* (2013.01); *E05B 2047/0091* (2013.01)

(56) References Cited

U.S. PATENT DOCUMENTS

| | | | | |
|---|---|---|---|---|
| 5,938,248 | A * | 8/1999 | Vickers | E05B 5/00 292/23 |
| 6,008,992 | A * | 12/1999 | Kawakami | E05B 47/0009 292/137 |
| 6,351,976 | B1 * | 3/2002 | Chen | E05B 13/10 292/336.3 |
| 6,615,623 | B1 | 9/2003 | Ormerod | |
| 9,466,190 | B2 * | 10/2016 | Musser | F16M 13/02 |
| 2004/0011095 | A1 * | 1/2004 | Gotou | E05B 1/0092 70/208 |
| 2004/0020251 | A1 * | 2/2004 | Ramsauer | E05B 17/04 70/208 |
| 2007/0240463 | A1 | 10/2007 | Antonucci | |
| 2008/0047308 | A1 * | 2/2008 | Stuckey | E05B 1/0092 70/215 |
| 2009/0007610 | A1 * | 1/2009 | Hoffmann | E05B 1/0092 70/192 |
| 2009/0214320 | A1 * | 8/2009 | Rudduck | E05B 65/006 411/357 |
| 2009/0250952 | A1 * | 10/2009 | Niskanen | E05B 47/0009 292/341.15 |
| 2012/0169072 | A1 * | 7/2012 | Maguire | E05B 1/0038 292/336.3 |
| 2013/0098123 | A1 * | 4/2013 | Gorontzi | E05B 1/0092 70/201 |
| 2014/0352223 | A1 * | 12/2014 | Le | E05B 17/002 49/344 |
| 2015/0300058 | A1 * | 10/2015 | Alexander | E05B 47/0009 292/63 |

FOREIGN PATENT DOCUMENTS

| | | | | |
|---|---|---|---|---|
| JP | 2008245143 | | 10/2008 | |
| WO | WO2004/001235 | | 12/2003 | |
| WO | WO2006/105585 | | 10/2006 | |
| WO | WO2009/039558 | | 4/2009 | |
| WO | WO 2009/039558 | | 4/2009 | |
| WO | WO 2009039558 A1 * | | 4/2009 | ........... E05B 1/0092 |

* cited by examiner

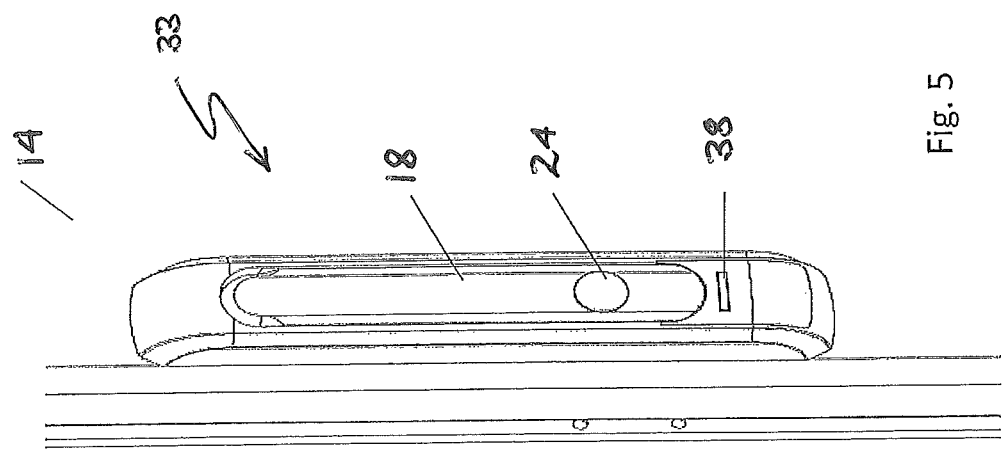
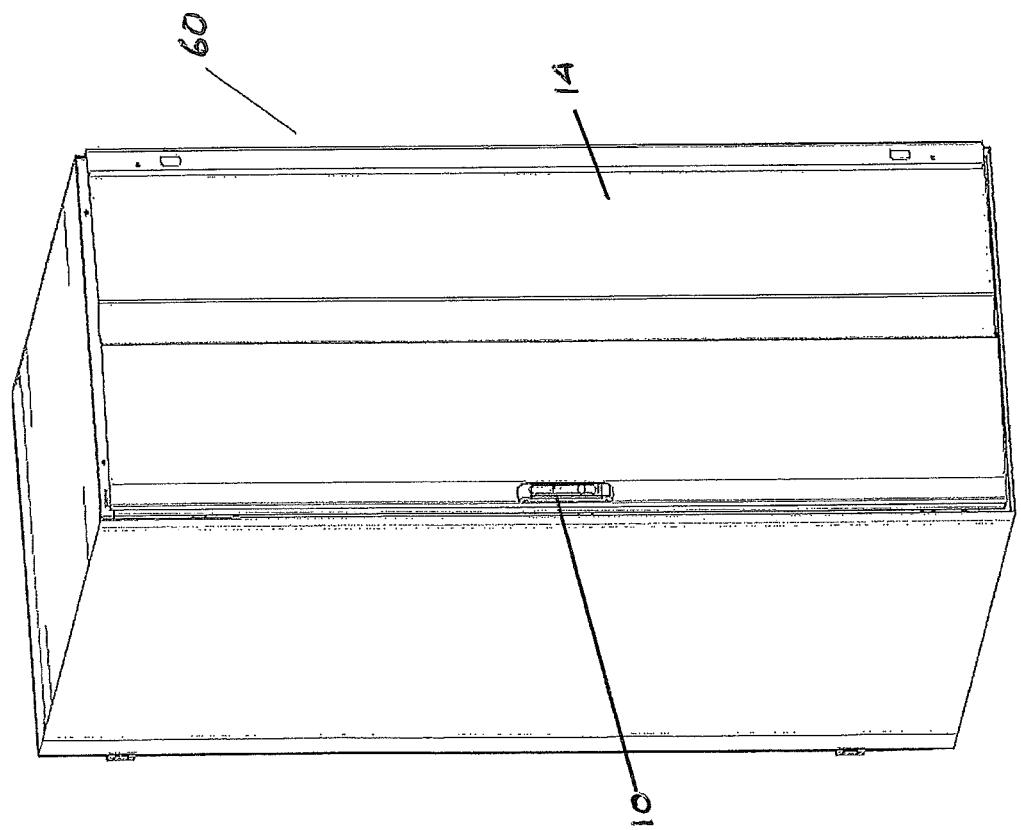

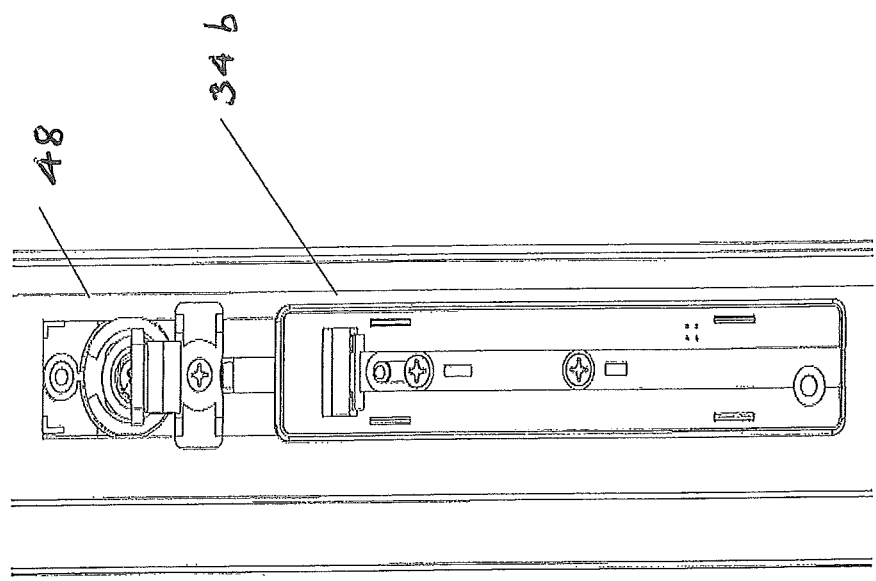
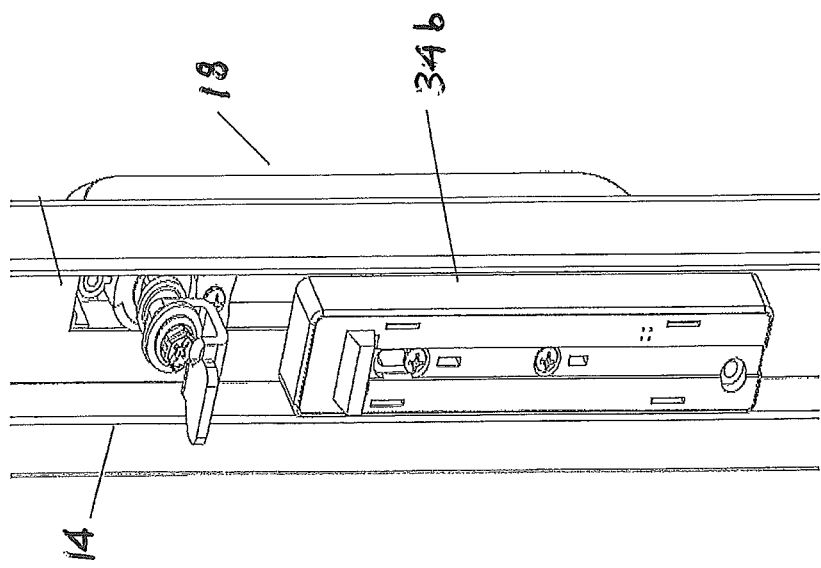

Locked       SMA Unlocked       Slam Locked

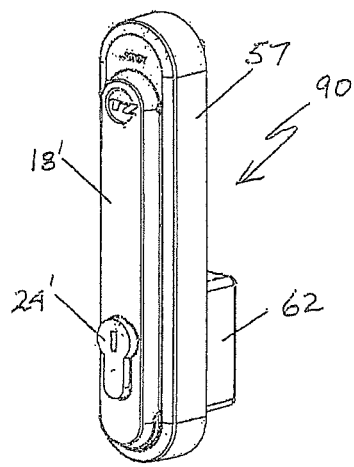
Step 1. Basic Handle
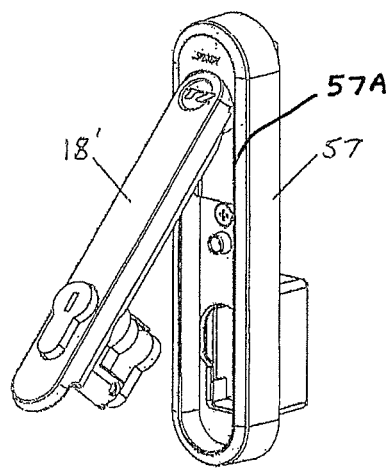
Step 2. Handle Raised
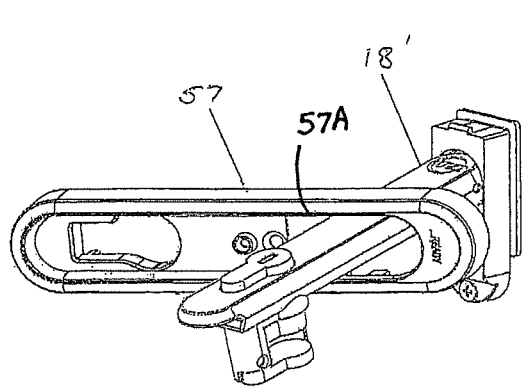
Step 3. Cover Removed
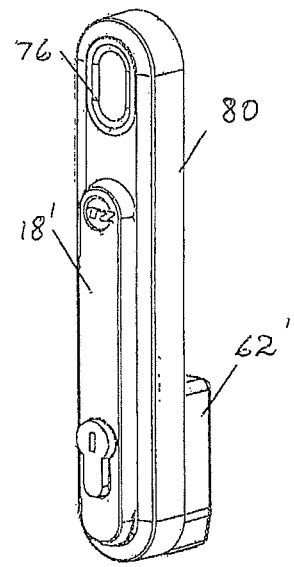
Step 4. Electronic Lock
Fig. 19

HANDLE ASSEMBLY

FIELD OF THE INVENTION

This invention relates to an assembly a handle for a door or the like. In particular, the invention concerns an assembly for a handle which can be converted from a mechanical format to an electronic format with reduced labour and reduced interference with the handle setup.

BACKGROUND OF THE INVENTION

A variety of locking mechanisms exist for preventing unauthorised access to an enclosure such as a room, locker, cabinet and the like. Typically, such locking mechanisms employ a mechanical locking means that secures a door in position within an access space to the enclosure, with the locking mechanism being activated and deactivated by an authorised key or the like.

For convenience, the background to the invention and the invention itself will be referred to generally below in connection with handle assemblies for doors used to secure data centre cabinets containing server racks or other computer equipment. However, it is to be understood that the invention is not limited to this environment and has application in wider fields. For example, the handle assembly of the present invention may be employed in a variety of alternative applications, including security cabinets, medicine cabinets, access panels, security doors and standard doorways and the like to provide a locking feature thereto and still fall within the spirit of the present invention.

Electronic locking rather than mechanical locking is often desirable, especially in high security situations. Electronic locking has the ability to have more sophisticated user recognition procedures and can maintain a log identifying who has had access, for example. Electronic locking can incorporate useful subsidiary features, including the use of lights to signal locked/unlocked states and signals to alert to potential security breaches, such as when a door has not been locked.

Traditionally, the locking mechanism is often provided separately to the door handle. The door handle has thus traditionally been a relatively passive device that merely provides a gripping means for a user to open the door. Hence, it has often been necessary to separately activate/deactivate the locking mechanism after/before the door has been closed/opened. Whilst such arrangements have proven effective where there is sufficient space on the door to accommodate a handle and a locking means, in many cabinets and the like, such as switchgear cabinets used in switching distribution centres such as telephone exchanges, there is limited space available and as such there is a need to provide a simple system that can function as both a locking mechanism and a handle to permit access of the cabinet only to authorised individuals.

One development in this area has been seen in Published US Patent Application No. 20120169072 (Maguire), the contents of which are incorporated herein by reference. That invention relates to a handle for a door comprising a body mountable to a surface of the door; a slide member configured to be received at least partially within said body so as to slidingly move between a first position wherein the slide member projects beyond the body and a second position wherein the slide member is substantially retracted into said body; a fastening member mounted within said body so as to receive at least a portion of said slide member when the slide member is in the second position so as to lock said slide member in the second position; and a locking mechanism configured to prevent opening of the door when said sliding member is in the second position, wherein sliding movement of said slide member from said first position to said second position engages the locking mechanism to prevent opening of the door.

In one aspect, this present invention may be regarded as building upon the invention in US Patent Application No. 20120169072, in that it provides for a locking handle assembly suitable for data centre cabinets; the locking handle can be compatible with single or multi point locking.

Installation of data centres can involve significant capital outlay. A data centre may involve a large number of server racks, secured by many doors. Each door requires its own handle and locking mechanism. While electronic locking may be greatly preferred, for economic reasons a mechanical locking system may be installed, with the intention of upgrading to a more sophisticated electronic locking system in the future. However, prior art conversion procedures are costly and labour-intensive, since the mechanical locking system must be dismantled from the door, including removing the handle and disconnecting the handle from the locking apparatus, which may include gearing, multi-point locking, rods systems, etc.

It is an object of the present invention, at least in some embodiments, to provide a handle assembly which facilitates upgrade from mechanical to electronic, in a relatively economic way.

In particular, it is an object of the present invention, at least in some embodiments, to enable a mechanical handle assembly to be easily upgraded to an electronic version, without removing the handle from the door. In this way, upgrade time and costs may be reduced, with minimum interference with the way in which the door is secured to the cabinet, whether that involves gearing, multi-point locking or use of rod systems.

The above references to and descriptions of prior proposals or products are not intended to be, and are not to be construed as, statements or admissions of common general knowledge in the art. In particular, the above prior art discussion does not relate to what is commonly or well known by the person skilled in the art, but assists in the understanding of the inventive step of the present invention, of which the identification of pertinent prior art proposals is but one part.

SUMMARY OF THE INVENTION

Accordingly, in one aspect of the invention there is provided a handle assembly for a door comprising:
  a first housing mountable to a surface of the door; and
  a handle configured to be received at least partially within the first housing and adapted to move between an unlocked position in which the handle protrudes from the housing and a locked position in which the handle is substantially within the housing;
wherein opening of the door when the handle is in the locked position is prevented by a lock;
and wherein the first housing is designed to be either:
  supplemented with an electronic actuating means; or
  replaceable by a second housing associated with an electronic actuating means, without requiring removal of the handle from the door.

In a second aspect, the invention provides, in relation to a handle assembly for a door comprising:
  a first housing mountable to a surface of the door; and a handle configured to be received at least partially within the first housing and adapted to move between an unlocked position in which the handle protrudes from the housing and a locked position in which the handle is substantially within the housing;

wherein opening of the door when the handle is in the locked position is prevented by a lock;

the provision of a second housing to replace the first housing without requiring removal of the handle from the door, the second housing being associated with electronic actuating means.

In a third aspect, the invention provides a method of upgrading a mechanically-locked handle assembly to an electronically-locked handle assembly, the mechanically-locked handle assembly having a first housing mounted to a surface of the door and a handle configured to be received at least partially within the first housing and adapted to move between an unlocked position in which the handle protrudes from the housing and a locked position in which the handle is substantially within the housing, opening of the door when the handle is in the locked position being prevented by a mechanical lock;

wherein the method includes the steps of:

removing the first housing without removing the handle from the door; and either:

supplementing the first housing with an electronic actuating means; or replacing the first housing with a second housing associated with electronic actuating means.

The handle for the handle assembly of the invention is preferably the type of handle known as a 'swing handle'; in this embodiment, once the handle is in the unlocked position in which it protrudes from the first or second housing, the handle may be rotated sideways through up to 360 degrees in order to assist in opening the door to which the handle may be attached.

The door for which the handle assembly is intended may be any suitable door. It is contemplated that the invention will find application for doors of server rack cabinets.

The first housing is preferably designed to assist the handle assembly to function with a mechanical lock. The mechanical lock may be of any suitable type. Most commonly, the mechanical locking system is a pin tumbler or disk tumbler lock operated by a key. The first housing may be smaller in size compared to the second housing, which is preferably designed to enable the handle to function with an electronic locking system.

It is preferred that the handle assembly of the invention, in the electronic version, will default to the locked position if a failure occurs. It is also anticipated that a keyed lock is included in the electronic version. The mechanical lock may be retained in the handle assembly of the invention after conversion to electronic locking to override the electronic actuation or to provide an alternate method of unlocking the handle in the event of a power failure, for example.

Both the first and second housings are able to accommodate the handle so that the handle is receivable at least partially within the housing in each case. Preferably, each housing is shaped to encircle the handle when the handle is in the locked position, so that the handle lies flush with the housing.

Preferably, especially where a number of doors have the handle assembly of the invention, a control panel is provided to facilitate central control of the handle assemblies so as to open/close the handle of each door as required.

The electronic actuating means is preferably a module having at least some of the components needed to allow the handle to move to the unlocked position electronically. In one embodiment, the electronic actuating module has a circuit board, a spring loaded catch, and a movable, spring loaded shuttle, wherein the shuttle is movable by an actuator. In this embodiment, the movement of the shuttle releases the catch in the unlocked position and secures the catch in the locked position. The actuator preferably includes shape memory alloy material which contracts when activated (for example, by heating). Further details are contained in US Patent Application No. 20120169072 and in the specifications incorporated therein by reference.

Preferably, this shape memory alloy material is in the form of a wire wound around the shuttle and attached at one end to the shuttle and at the other to a non-movable part of the electronic actuating means. When the shape memory alloy wire is caused to contract by the application of suitable energy to reach the necessary temperature, the shuttle moves from the locked position to the unlocked position. A second shape memory alloy wire may be similarly connected to the shuttle in order to move it from the unlocked position to the locked position. The energy may be supplied to the actuator from an external controller.

The electronic actuating means may use other types of components instead of those described above. In particular, the shuttle assembly may be replaced by other types of fasteners, such as those described in patent specifications WO2006/105585 and WO2004/001235, the contents of which are incorporated herein by reference.

The handle assembly of the invention may also include a temperature sensor for sensing the temperature of the shape memory alloy wire (if present). This can adjust the amount of energy applied to the shape memory alloy wire from the controller, depending on sensed temperature, to take into account varying conditions. For example, if the temperature is relatively low, a larger amount of power may need to be delivered to the shape memory alloy wire from the controller to heat it to the desired temperature. Conversely, if the temperature is high, the amount of power to be delivered to the shape memory alloy wire in order to cause it to contract may be far less. A temperature sensor can enable feedback and cause adjustment of power delivery in this regard In especially preferred embodiments, the majority of components associated with the second housing, including the electronic actuating means, are located on the outside of the door to which the handle assembly is to be attached. This configuration can be advantageous in that minimum volume within the cabinet is occupied by components associated with the handle assembly and the layout of server racks, for example, is undisturbed.

The second housing for the handle assembly may include an indicator to provide a visual indication as to the status of the handle—for example, to identify whether the handle, and hence the door, is locked or unlocked. The indicator is preferably on the outer face of second housing and preferably takes the form of a light member, such as an LED, that displays a green light to indicate that the door is unlocked or a red light to indicate that the door is locked and secured. Further options may include an orange light to indicate the handle is unlocked and waiting to be opened and a flashing red light to indicate an error or bypass status.

It will also be appreciated that the status of the handle itself may also provide a visual indication as to whether the door is locked or unlocked: a user may observe that the handle is protruding from the first or second housing, to indicate that the handle is unlocked, or flush with the first or second housing, to indicate that the handle is locked.

Access to the handle assembly of the invention in the mechanical lock version will normally be achieved through insertion of an authorised key into the mechanical lock. Access to the handle assembly of the invention in the electronic lock version may be by any suitable means, depending on the lock setup.

For example, access may involve an access card or an access code, with or without biometric identification or other secondary security identification. Preferably, the individual enters a security code into a central control panel, which may be in the form of a touch-panel computer screen. A controller then processes the code entered by the individual and opens the associated handle. The central control panel may have a card reader or biometric identification unit, as required.

To lock the handle, the individual preferably closes the door and pushes the handle into the second housing. Preferably, the assembly is designed so that this action engages the electronic lock ('slam to lock'). One or more sensors may be provided in the second housing to determine the locking state, with such data being sent to the controller, logged and stored appropriately.

The handle assembly can be used with a variety of remote sensors and control systems in accordance with a variety of different applications.

BRIEF DESCRIPTION OF THE DRAWINGS

Preferred embodiments of the present invention will now be described with particular reference to the accompanying drawings. However, it is to be understood that the features illustrated in and described with reference to the drawings are not to be construed as limiting on the broad scope of the invention.

In the drawings:

FIG. 4 depicts the handle assembly of FIG. 1 or 2 placed on the door of a server rack cabinet;

FIG. 5 shows a close-up view of the handle assembly of FIG. 2 placed on the door as in FIG. 4;

FIG. 6 is a perspective view of the electronic actuating module of FIG. 3, in position on the rear of the door;

FIG. 7 is a rear elevation of the module of FIG. 6;

FIG. 19 shows an embodiment of the method of the invention when converting the mechanically-locked handle assembly to the electronic version, involving replacing the first housing with a second housing.

DETAILED DESCRIPTION OF THE PREFERRED EMBODIMENTS

Figure 1:
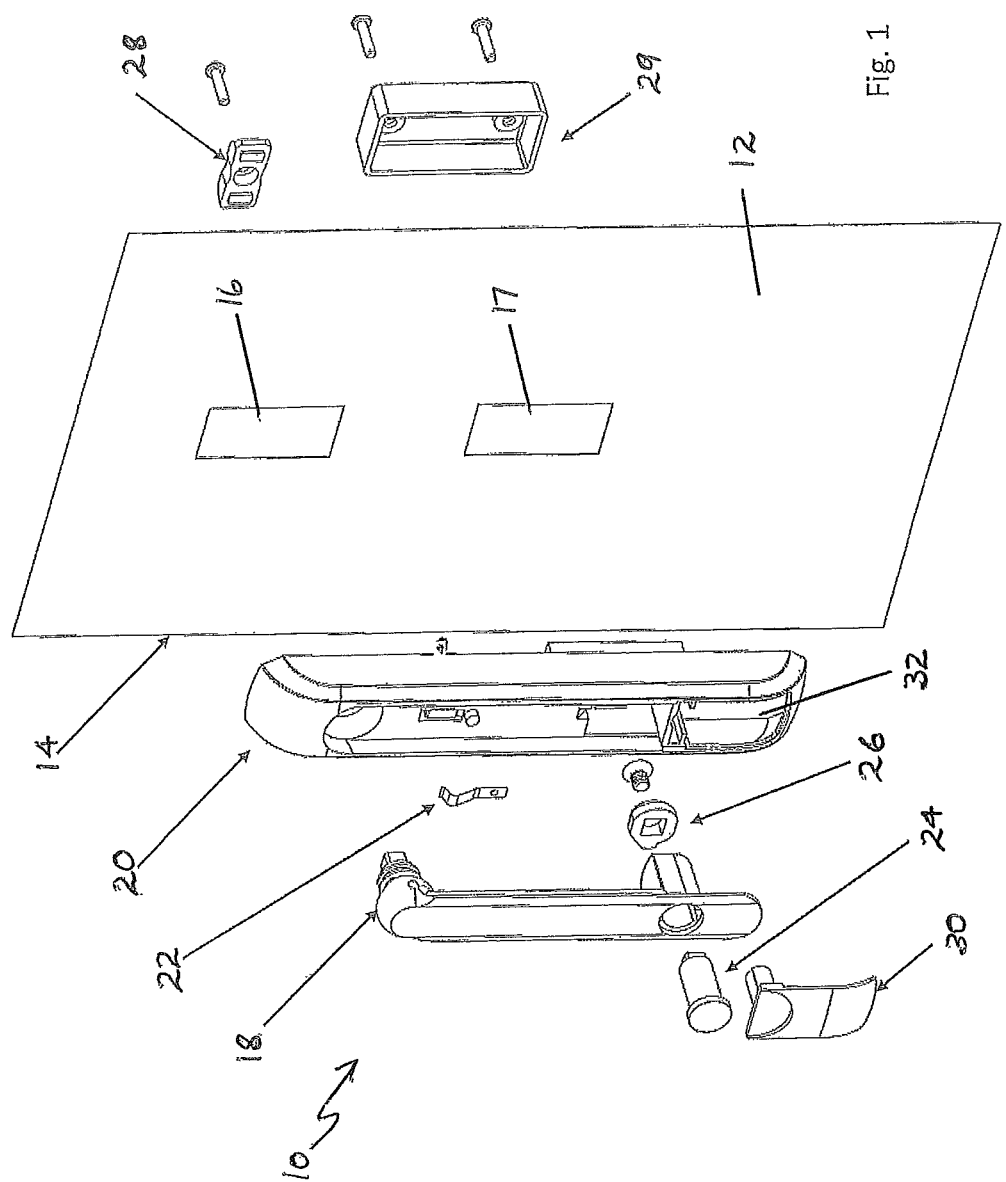
FIG. 1 depicts an exploded view of an embodiment of a mechanical handle assembly with part of a door to which the mechanical handle assembly is to be mounted.

With reference to the embodiment in FIG. 1, mechanical handle assembly 10 is mountable to front surface 12 of a door, part of which is shown at 14. As per usual industry standard, door 14 includes two cut outs 16 and 17.

Handle 18 is designed to be received within housing 20. In the locked position, handle 18 is designed to protrude partly from housing 20, while in the locked position handle 18 is designed to be received within housing 20. Further details are explained below with regard to the embodiment in FIG. 19. Handle 18 is caused to protrude from housing 20, when unlocked, by a spring 22. Handle 18 has connected to it a standard keyed lock cylinder 24. Unlocking lock cylinder 24 with an authorised key (not shown) turns cam 26 located within first housing 20, which in turn releases the mechanical locking mechanism (not shown) for door 14.

Clamps 28 and 29 with associated screws connect handle assembly 10 to door 14. Face plate 30 covers cavity 32 in first housing 20.

Figure 2:
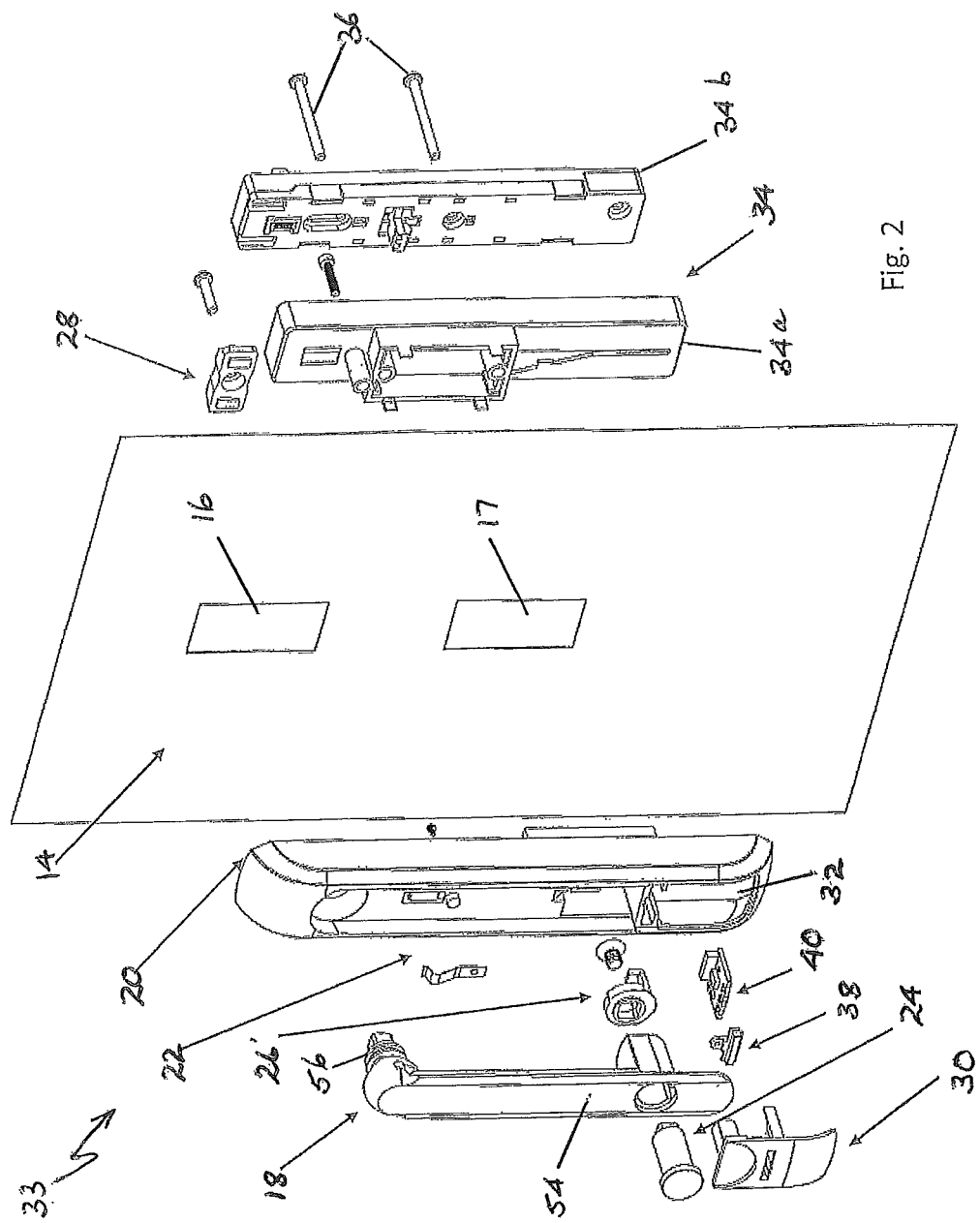
FIG. 2 depicts an exploded view of an embodiment of an electronic handle assembly to which the mechanical handle assembly of FIG. 1 is to be upgraded.

Turning now to FIG. 2, it will be noted that in this embodiment the same first housing 20 has been supplemented with an electronic actuator means in order to convert the mechanical lock of FIG. 1 to the electronic lock of FIG. 2.

In FIG. 2, electronic handle assembly 33 has handle 18, spring 22, lock cylinder 24 (retained for override purposes), clamp 28 and face plate 30, being the same as shown in FIG. 1. In this embodiment, the electronic actuating means takes the form of electronic actuating module 34 contained in front housing 34A and rear housing 34B.

To convert the mechanical handle assembly 10 of FIG. 1 to the electronic handle assembly 33 of FIG. 2, clamps 28 and 29 are removed from the rear of door 14 and electronic module 34 is positioned on the rear of door 14. Clamp 28 is used to support housing 20 and module 34. Instead of clamp 29 used with handle assembly 10, screws 36 pass through electronic module rear housing 34B and electronic module front housing 34A into housing 20.

Lock status indicator 38 is inserted into cavity 32, and operated by circuit board 40.

Cam 26 of FIG. 1 is replaced by cam 26'.

Figure 3:
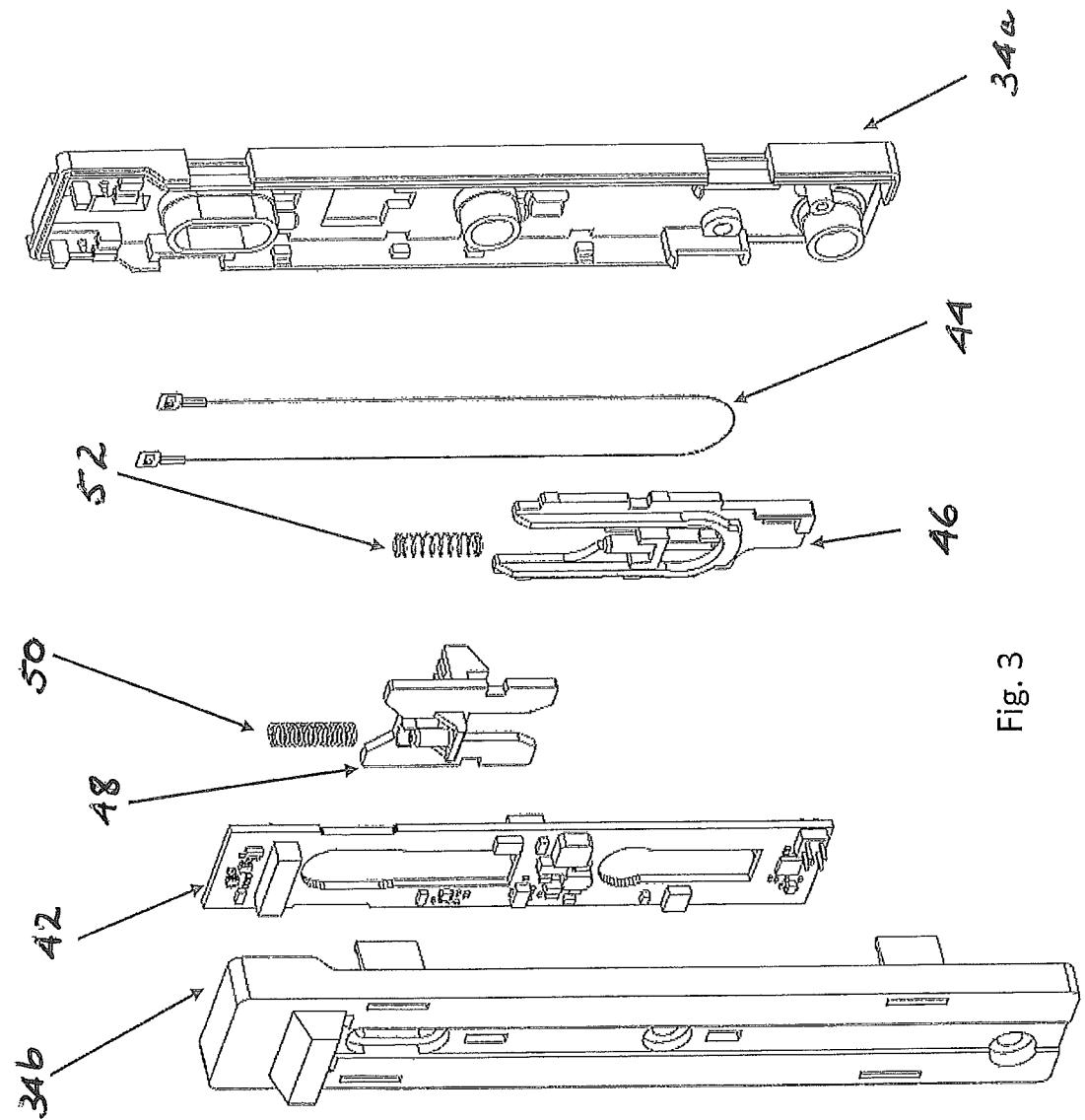
FIG. 3 depicts an exploded view of an embodiment of an electronic actuating means being a module.
Figure 8:
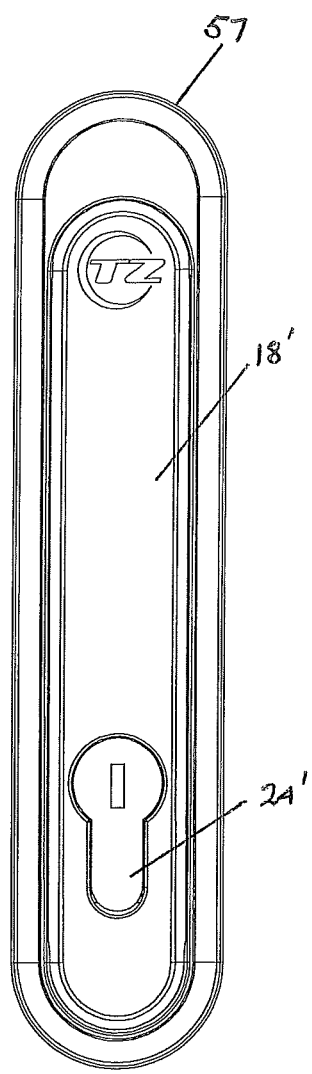
FIG. 8 shows a front elevation of a second embodiment of a mechanical handle assembly.

In the detailed view in FIG. 3, electronic actuating module 34 is shown to contain its parts enclosed between front housing 34A and rear housing 34B, the orientation of electronic actuating module 34 being reversed from that shown in FIG. 2.

A second circuit board 42 controls actuation of shape memory alloy wire 44 wound around shuttle 46 and connected to catch 48 biased by spring 50. Shuttle 46 is biased by spring 52.

When shape memory alloy wire 44 is energised via second circuit board 42, shape memory alloy wire 44 contracts and drives movement of shuttle 46, causing catch 48 to release and unlock handle 18. Base 54 is caused to protrude out of housing 20 by spring 22. Handle 18 can then be pivoted at 56 to swing to the side, to provide sufficient traction to release door 14 from its cabinet 60, as shown in FIG. 4.

In FIG. 5, electronic handle assembly 33 is shown mounted on door 14 of cabinet 60.

Figure 9:
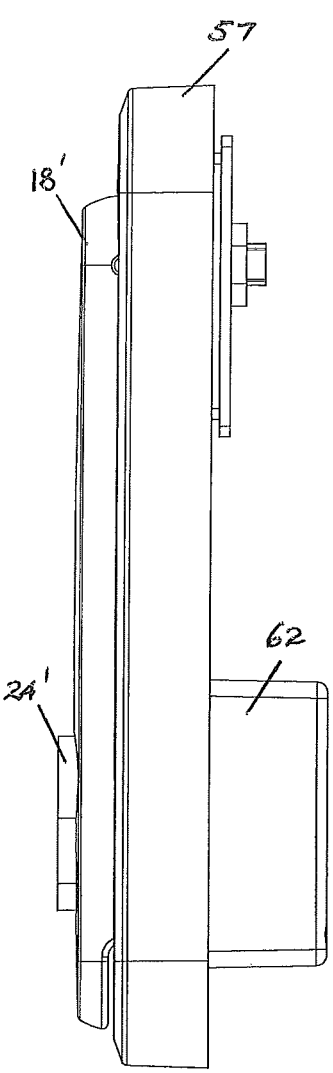
FIG. 9 is a side elevation of the handle assembly of FIG. 8.
Figure 10:
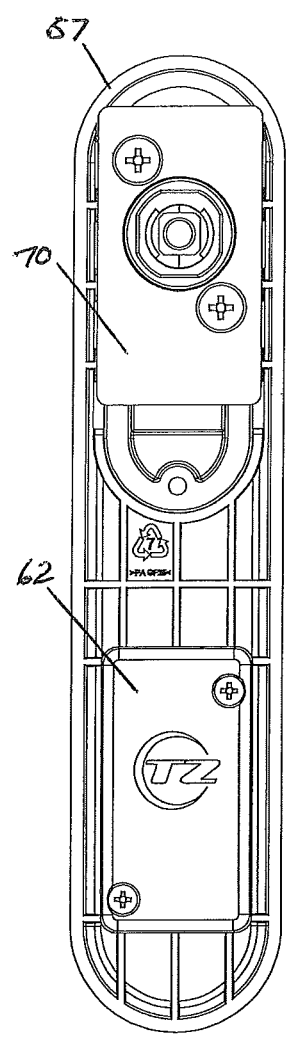
FIG. 10 is a rear elevation of the handle assembly of FIGS. 8 and 9.

In contrast to the previously-described embodiment, the embodiment in FIGS. 8 to 19 replaces first housing 57 with second housing 80. As can be readily appreciated from FIG. 19, in handle assembly 90, first housing 57 is smaller than second housing 80. Handle 18' is essentially the same as handle 18 in the first embodiment, with only minor design changes around lock cylinder 24'. Lock cylinder 24' is preferably a Euro-cylinder lock. As shown in FIGS. 9 and 19, lock cylinder 24' is received into housing 62.

Figure 11:
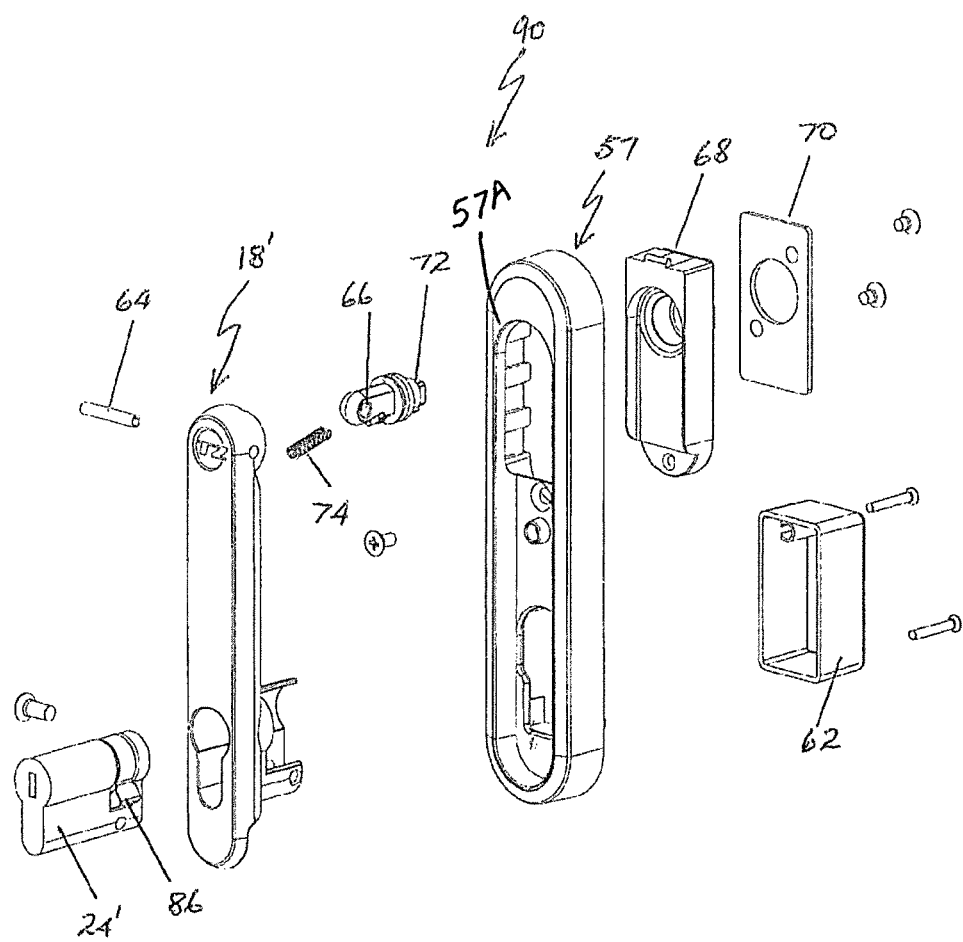
FIG. 11 is an exploded view of the mechanical handle assembly of FIGS. 8 to 10.

Handle 18' works as described for handle 18 in the previous embodiment. FIG. 11 shows how handle 18 is connected by roll pin 64 to handle spindle 72, roll pin 64 fitting through aperture 66. Handle spindle 72 is received within handle mount block 68, which includes backing plate 70.

The electronic lock embodiment 100 shown in FIGS. 12 to 15 has a second housing 80 which is larger than first housing 57. In addition, this embodiment is designed so that most components are contained within housing 80 on the front surface 12 of door 14.

In this embodiment, spring 22 of the first embodiment is replaced by coil spring 74. Light pipe indicator 76 can be lit to indicate lock status—red for locked, flashing red for error, orange to indicate unlocked and awaiting opening, and green to indicate unlocked and open. Other colour signals are within the scope of the invention.

Lock linkage 78 is engageable by lock barrel arm 86 to lock handle assembly 100. Part of the electronic actuating means is sma wire 44, biased by slide springs 84 and coordinating with lock slider and 'slam lock' slider both indicated at 82. Housing 62' I similar to housing 62 and receives lock cylinder 24'.

Figures 16, 17, 18:
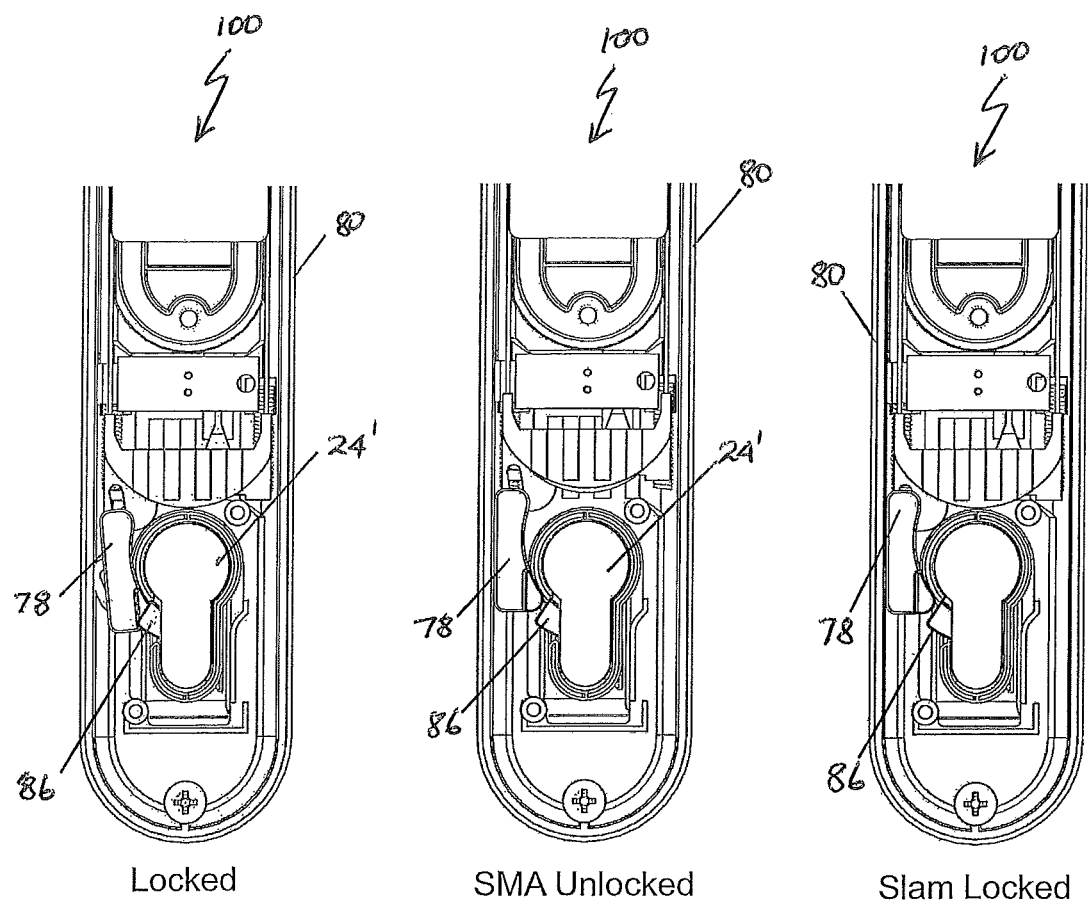
FIG. 16 shows a detail of part of the electronic actuating means of the electronic handle in FIGS. 12 to 15, in the locked position.
FIG. 17 is the same view as in FIG. 16, but showing the unlocked position.
FIG. 18 is the same view as in FIGS. 16 and 17, but depicting the "slam locked" position.

FIGS. 16 to 18 show three states of handle assembly 100. In FIG. 16, barrel arm 86 engages lock linkage 78 and handle assembly 100 is locked.

In FIG. 17, the electronic actuating means has been activated, sma wire 44 has contracted, and lock linkage 78 has been brought out of engagement with barrel arm 86 to the unlocked position. Spring 74 would bias handle 18' to protrude from housing 80 (not shown in this Fig.).

It is to be noted that this has occurred electronically, without the need to unlock lock cylinder 24' by a key. In FIG. 18, handle 18' (not shown) has been 'slam locked' into housing 80. This Figure represents a transient state, since lock linkage 78 will proceed from the state shown in FIG. 18 to engage barrel arm 86, to take the configuration shown in FIG. 16.

Figure 12:
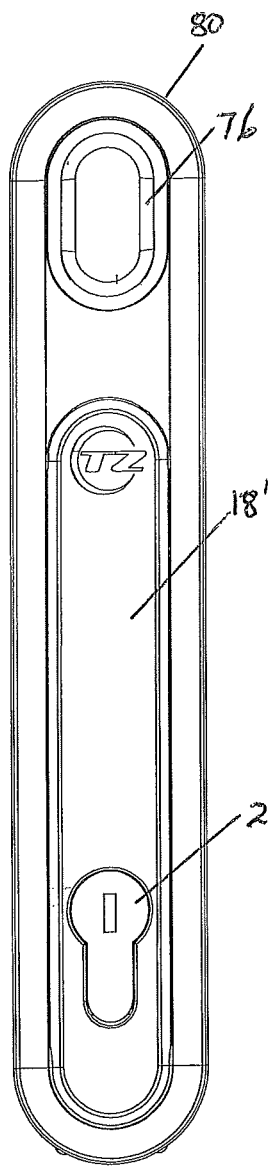
FIG. 12 shows a front elevation of a second embodiment of an electronic handle assembly, to which the mechanical handle assembly of FIGS. 8 to 11 is to be upgraded.
Figure 13:
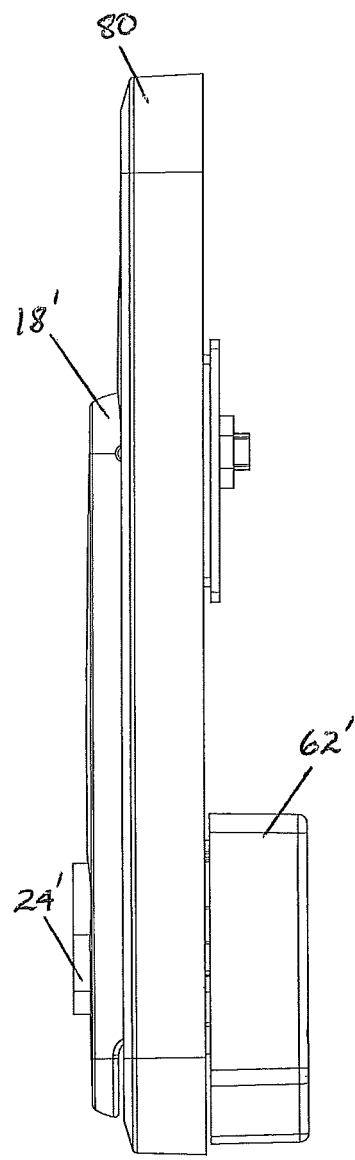
FIG. 13 is a side elevation of the handle assembly of FIG. 12.
Figure 14:
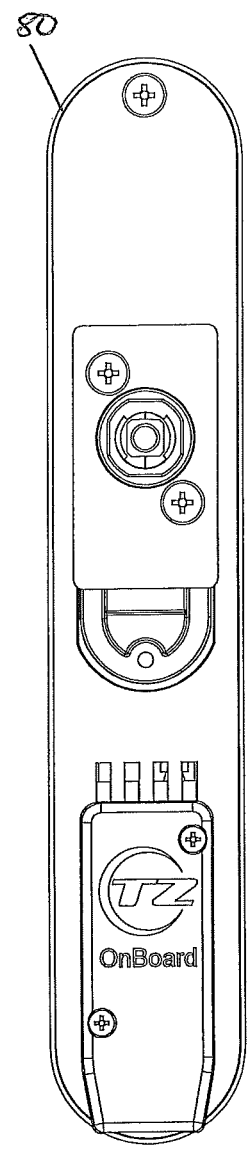
FIG. 14 is a rear elevation of the handle assembly of FIGS. 12 and 13.
Figure 15:
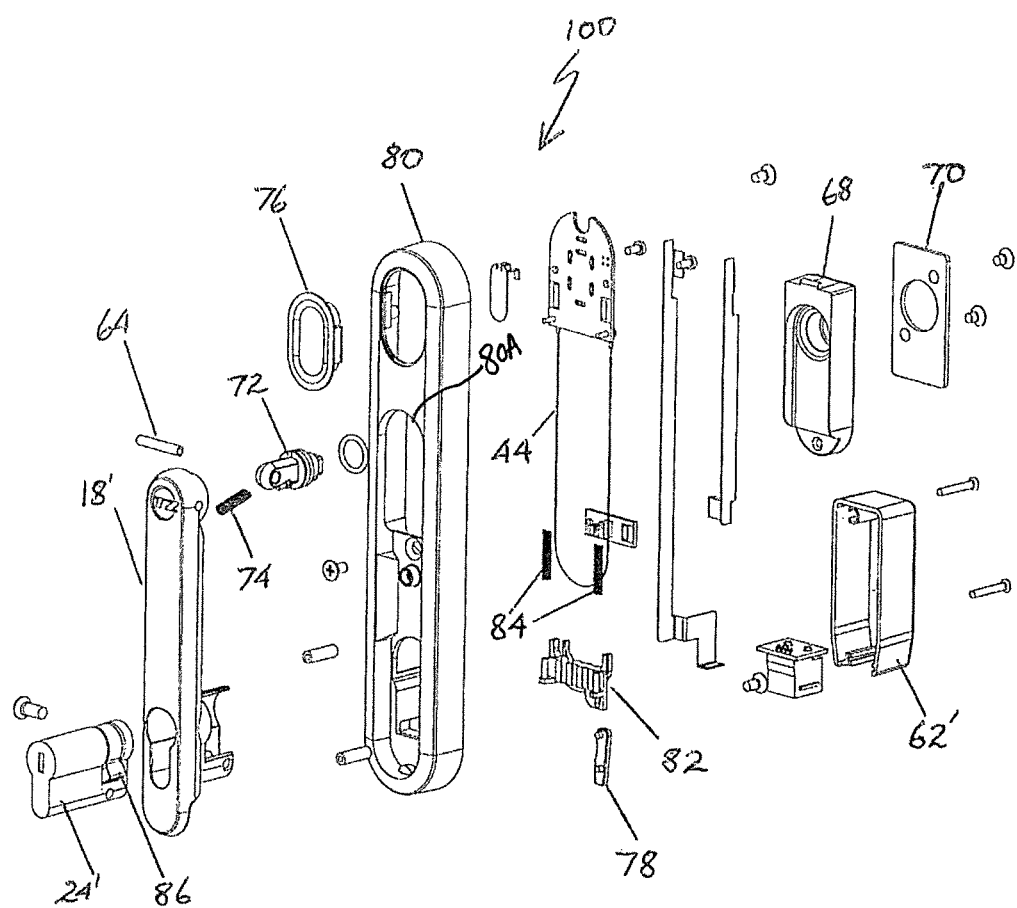
FIG. 15 is an exploded view of the electronic handle assembly of FIGS. 12 to 14.

Referring now to FIG. 19, Step 1 shows the basic or mechanical handle assembly as in FIGS. 12 to 14. In Step 2, handle 18' has been unlocked and biased towards the partly protruding position. In Step 3, first housing 57 is being removed by passing the handle 18' through an aperture 57A of the housing 57. As can be seen, handle 18' remains attached to the door (not shown). In Step 4, light pipe indicator 76 has been coupled to second housing 80, second housing 80 has replaced first housing 57, electronic actuating components (not shown) have been inserted within housing 80 and housing 62' has replaced former housing 62. The second housing 80 includes an aperture 80A such that the handle 18' is received in a similar manner as described with respect to the first housing 57 and its aperture 57A.

It is to be understood that the word 'door' is intended to refer to any suitable closure, including a drawer.

INDUSTRIAL APPLICABILITY

The handle assembly and method of the invention enable conversion of mechanical handles assemblies to electronic handle assemblies in an economical and labour-efficient manner with minimum disruption to (for example) server rack cabinets.

The invention claimed is:

1. A swing handle assembly attachable to a door, comprising:
   an elongated swing handle which is peripherally encircled by and at least partially received in a housing in a locked position of the elongated swing handle; the elongated swing handle having a lock cylinder;
   the housing having a first aperture through which the elongated swing handle is attachable to the door;
   the housing having a second aperture in which the lock cylinder is received;
   the lock cylinder having a lock barrel arm;
   a roll pin fitted through the first aperture such that the elongated swing handle is pivotably disposed in the first aperture;
   a spring biasing the elongated swing handle to pivotably protrude from the housing when the swing handle is in an unlocked position;
   the elongated swing handle being pivotable relative to the roll pin as the elongated swing handle pivotably protrudes from the housing;
   an electronic actuator comprising a shape memory alloy wire;
   a lock slider biased by one or more slide springs, the lock slider being configured to lock the lock cylinder;
   wherein the shape memory alloy wire is attached to the lock slider to act against a biasing action of the one or more slide springs when activated by the electronic actuator to unlock the swing handle; and
   wherein the first aperture is sized such that the elongated swing handle is receivable through the first aperture to enable removal of the housing while the elongated swing handle remains attached to the door.

2. The swing handle assembly of claim 1, further comprising a light indicator configured to indicate lock status.

3. The swing handle assembly of claim 2, wherein the light indicator displays a red light to indicate lock status as locked, a flashing red light to indicate lock status as error, and orange light to indicate lock status as unlocked, and a green light to indicate lock status as open.

4. A swing handle assembly attachable to a door, comprising:
   a housing having a first aperture and a second aperture;
   the first aperture being spaced from said second aperture and each having different shapes;
   an elongated swing handle received at least partially through the first aperture, the elongated swing handle being configured to be coupled to the door and transitionable between a locked position and an unlocked position, the elongated swing handle having a lock cylinder;
   the first aperture being sized such that the elongated swing handle is receivable through the first aperture such that the housing is removable while the swing handle remains coupled to the door;

the lock cylinder received in the second aperture;
a lock slider biased by one or more slide springs, the lock slider being operatively coupled to the lock cylinder and configured to lock the lock cylinder;
a pin being disposed in the first aperture;
a spring biasing the swing handle to pivot about the pin when the swing handle is in the unlocked position; and
an actuator comprising a shape memory alloy wire that is attached to the lock slider to act against a biasing action of the one or more slide springs upon actuation of the actuator to cause the swing handle to transition to the unlocked position.

\* \* \* \* \*